(12) United States Patent
Ueda et al.

(10) Patent No.: US 6,180,217 B1
(45) Date of Patent: Jan. 30, 2001

(54) ORGANIC ELECTROLUMINESCENT ELEMENT

(75) Inventors: Hideaki Ueda, Kishiwada; Keiichi Furukawa; Yoshihisa Terasaka, both of Suita, all of (JP)

(73) Assignee: Minolta Co., Ltd., Osaka (JP)

( * ) Notice: Under 35 U.S.C. 154(b), the term of this patent shall be extended for 0 days.

(21) Appl. No.: 09/039,621

(22) Filed: Mar. 16, 1998

(30) Foreign Application Priority Data

Mar. 19, 1997 (JP) .................................................... 9-066009
Sep. 24, 1997 (JP) .................................................... 9-258929

(51) Int. Cl.$^7$ ............................. H05B 33/00; B32B 7/02
(52) U.S. Cl. .................... 428/212; 428/690; 428/917; 313/504; 313/506
(58) Field of Search .................................. 428/690, 691, 428/917, 212; 313/504, 506

(56) References Cited

U.S. PATENT DOCUMENTS

| | | | |
|---|---|---|---|
| 3,530,325 | 9/1970 | Mehl et al. ........................... | 313/108 |
| 4,539,507 | 9/1985 | VanSlyke et al. .................... | 313/504 |
| 4,720,432 | 1/1988 | VanSlyke et al. .................... | 428/457 |
| 5,343,050 | * 8/1994 | Egusa et al. ........................... | 257/40 |
| 5,358,788 | * 10/1994 | Kawamura et al. .................. | 428/446 |
| 5,674,597 | * 10/1997 | Fujii et al. ............................ | 428/212 |
| 5,709,959 | * 1/1998 | Adachi et al. ....................... | 428/690 |

FOREIGN PATENT DOCUMENTS

| | | |
|---|---|---|
| 59-194393 | 11/1984 | (JP) . |
| 63-295695 | 12/1988 | (JP) . |
| 05299174 | 12/1993 | (JP) . |

* cited by examiner

*Primary Examiner*—Marie Yamnitzky
(74) *Attorney, Agent, or Firm*—Morrison & Foerster LLP

(57) ABSTRACT

An organic electroluminescent element having excellent durability with increased luminescence intensity, low luminescence starting voltage, and excellent stability with repeated use. An organic electroluminescent element having at least a positive electrode, hole-injection layer, hole-transporting layer, luminescent layer, and negative electrode, wherein the positive electrode has an ionization potential of 5.18–5.35 eV, the hole-injection layer has an ionization potential of 4.80–5.18 eV, and the hole-transporting layer has an ionization potential of 5.20–5.70 eV.

24 Claims, 3 Drawing Sheets

ORGANIC ELECTROLUMINESCENT ELEMENT

This application is based on Japanese application Nos. 09-66009 and 09-258929, the content of which is incorporated herein by reference.

BACKGROUND OF THE INVENTION

1. Field of the Invention

The present invention relates to an organic electroluminescent element.

2. Description of the Related Art

Electroluminescent elements comprise at least a light-emitting material. Organic electroluminescent elements are elements constructed using organic compounds which emit light in response to electric signals.

Organic electroluminescent elements basically comprise an organic luminescent layer interposed between a pair of opposed electrodes. Luminescence is a phenomenon which occurs when a luminescent body within the luminescent layer is excited to a higher energy level and the excited luminescent body returns to its original base state discharging said surplus energy as light. This is achieved by the injection of electrons from one electrode and the injection of holes from the other electrode.

In order to improve luminescence efficiency, the aforesaid basic construction is supplemented by a hole-injection layer added to the electrode that injects holes, while an electron transport layer is added to the electrode that injects electrons.

An example of an electroluminescent element is disclosed in U.S. Pat. No. 3,530,325 which uses single crystals of anthracene in the luminescent element.

Japanese Laid-Open Patent No. 59-194393 discloses a combination of a hole-injection layer and an organic luminescent layer.

Japanese Laid-Open Patent No. 63-295695 discloses a combination of an organic hole-injection/transporting layer and an organic electron-injection/transporting layer.

Organic electroluminescent elements having the aforesaid laminate layer construction are prepared by superimposing an organic fluorescent body, charge-transporting organic material (charge-transporting member), and electrodes, such that luminescence is generated when holes and electrons injected by their respective electrodes move within the charge-transporting member and recombine. Examples of materials which are useful as organic fluorescent bodies include organic pigments which generate fluorescence such as 8-quinolinol-aluminum complex, coumarin compounds and the like. Examples of useful charge-transporting materials include N'-di(m-tolyl)N,N'-diphenylbenzidene, 1,1-bis[N,N-di(p-tolyl)aminophenyl]cyclohexane and diamino compounds, 4-(N,N-diphenyl)aminobenzaldehyde-N,N-diphenylhydrazone compounds and the like. The use of porphyrin compounds such as copper phthalocyanine has also been proposed.

Although organic electroluminescent elements have high luminescence characteristics, prior art devices have been shown to have inadequate stability when luminescent and/or during storage. Thus, they are not suitable for practical use. The stability of the charge-transporting layer in prior art devices has been poor, resulting in instability in the element during luminescence and/or storage. The layers of the electroluminescent element formed by organic material range in thickness from a hundred to several hundred nanometers, and require high voltage application per unit thickness. Furthermore, such elements generate heat due to current flow and luminescence; therefore, the charge transporting material must be electrically, thermally, and chemically stable.

OBJECTS AND SUMMARY

In view of the above, an objective of the present invention is to provide an organic electroluminescent element having high luminescent intensity together with functional stability despite repeated use.

These objectives are attained by providing an organic electroluminescent element comprising:
- a positive electrode having an ionization potential of 5.18–5.35 eV;
- a hole-injection layer having an ionization potential of 4.80–5.18 eV;
- a luminescent layer;
- a hole-transporting layer having an ionization potential of 5.20–5.70 eV; and
- a negative electrode.

Another objective of this invention is to provide a display element comprising an organic electroluminescent element. A further objective of this invention is to provide a method for manufacturing an organic electroluminescent element.

BRIEF DESCRIPTION OF THE DRAWINGS

The above, and other objectives and features of the present invention, will become apparent from the following description of the preferred embodiments thereof taken in conjunction with the accompanying drawings, in which.

In the following description, like parts are designated by the same reference numbers in all of the drawings.

DETAILED DESCRIPTION OF THE PREFERRED EMBODIMENTS

The following description is presented to enable any person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The present invention relates to an organic electroluminescent element provided with a positive electrode, hole-injection layer, hole-transporting layer, luminescent layer, and negative electrode, wherein said positive electrode has an ionization potential of 5.18–5.35 eV, said hole-injection layer has an ionization potential of 4.80–5.18 eV, and said hole-transporting layer has an ionization potential of 5.20–5.70 eV.

Figure 1:
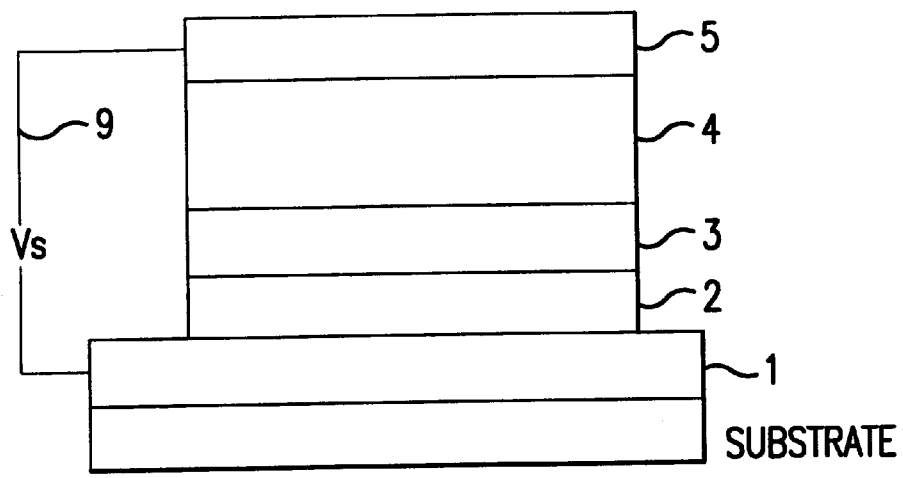
FIG. 1 is a cross-sectional view showing an embodiment of the organic electroluminescent element of the present invention, comprising a substrate, a positive electrode, a hole-injection layer, a hole-transporting layer, an organic luminescent layer, and a negative electrode.

The organic electroluminescent element of the present invention comprises at least a hole-injection layer (2), a hole-transporting layer (3), and an organic luminescent layer (4) interposed between a positive electrode (1), and a negative electrode (5), as shown in FIG. 1.

The conductive materials used as positive electrodes (1) of the organic electroluminescent element will have an ionization potential of 5.18–5.35 eV, and preferably 5.20–5.35 eV, which can be obtained by controlling the amount of doping or degree of oxidation of conductive metallic compounds such as tin oxide, indium oxide, antimony oxide, zinc oxide, zirconium oxide and the like. The positive electrode may have an ionization potential of 5.18–5.35 eV adjusted by a method such as oxygen plasma or the like.

Examples of metals useful as the negative electrode include silver, aluminum, and metals having work function of less than 4 eV including magnesium, calcium, titanium, yttrium, lithium, gadolinium, ytterbium, ruthenium, manganese and alloys thereof. Alloys of silver and magnesium, as well as aluminum are also desirable.

The electrical resistance of the positive and negative electrodes will be preferably as low as possible from the perspective of current flow impairment and heat generation; specifically a resistance of 100 Ωcm (volume resistivity) is desirable.

In organic electroluminescent elements, it is necessary that at least the positive electrode (3) or negative electrode (5) is a transparent electrode so that the luminescence is visible. Since when the negative electrode is made the transparent electrode it is readily subject to oxidation deterioration and resultant loss of transparency, it is desirable that the positive electrode be made the transparent electrode.

When forming a transparent electrode, conductive materials such as those listed above may be formed on a transparent substrate using a method such as vacuum deposition, spattering and the like, sol-gel, or an application of said material dispersed in resin or the like so as to maintain a desired light transmittance and electrical conductivity.

The transparent substrate is not particularly limited insofar as said material is transparent and has suitable strength and is impervious to adverse effects of heat during vacuum deposition and during manufacture of the organic electroluminescent device. Examples of useful materials include glass, and transparent resins such as polyethylene, polypropylene, polyether sulfone, polyether-etherketone and the like. Well known commercial products such as indium-tin oxide ("ITO"), NESA and the like may be used to form a transparent electrode on a glass substrate. NESA is a commercial product of Corning, Co.

The hole-injection layer (2) is formed on the positive electrode (1) so as to have an ionization potential of 4.80–5.18 eV, and preferably 4.80–5.15 eV. It is desirable that the ionization potential of the hole-injection layer (2) is less than the ionization potential of the positive electrode (1), i.e., 0.05–0.40 eV lower, and preferably 0.08–0.45 eV lower.

Compounds for forming the hole-injection layer are compounds having hole transportability, and are not specifically limited insofar as such materials possess the aforesaid characteristics; examples of useful materials include styryl compounds. More specifically, desirable compounds are described below. These compounds may be used in combinations of two or more.

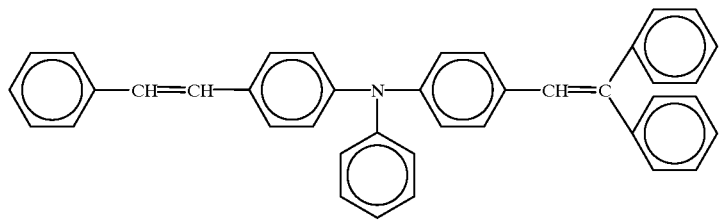

(1)

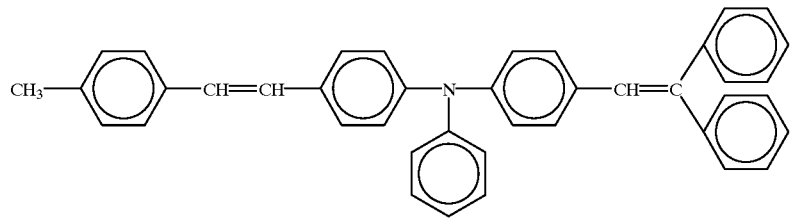

(2)

-continued
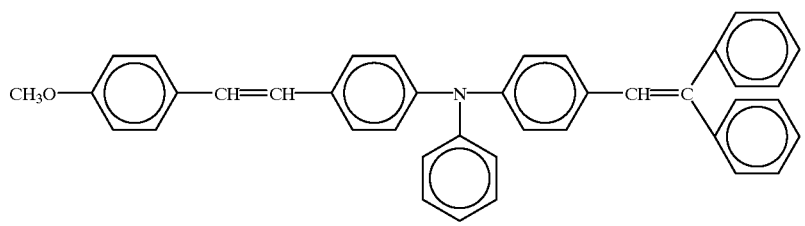
(3)
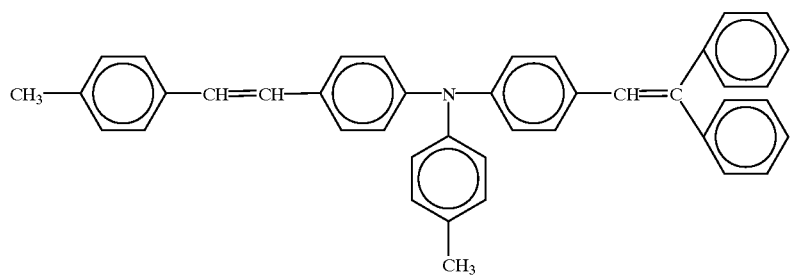
(4)
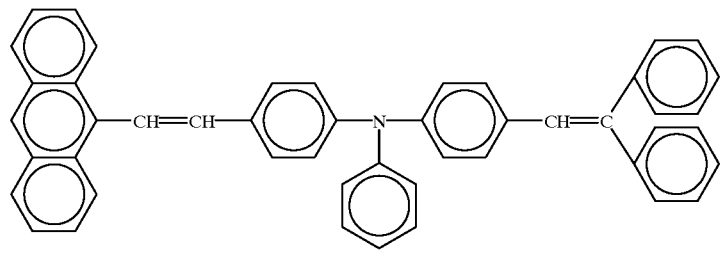
(5)
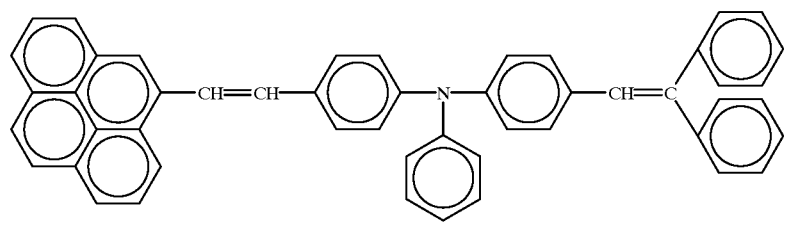
(6)
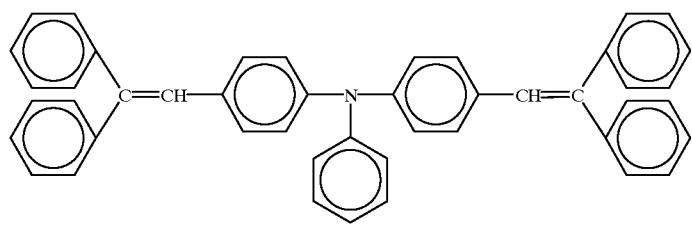
(7)
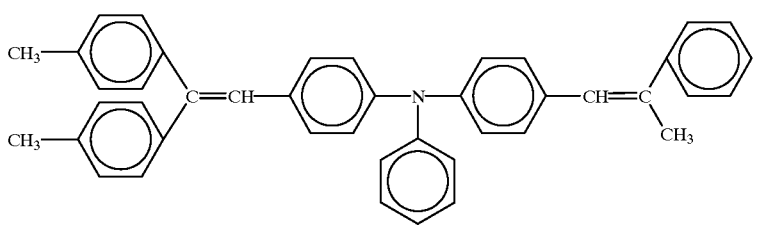
(8)

-continued
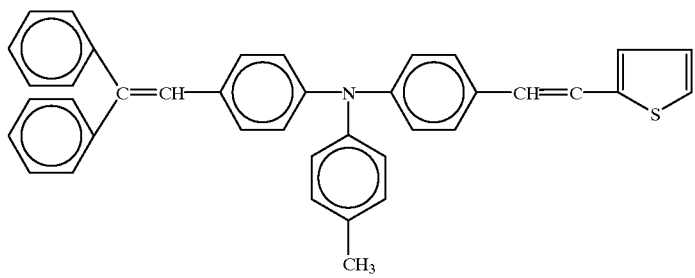
(9)
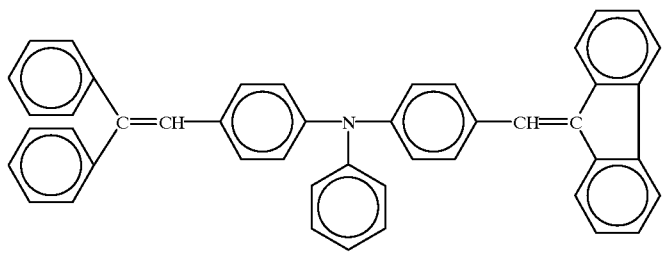
(10)
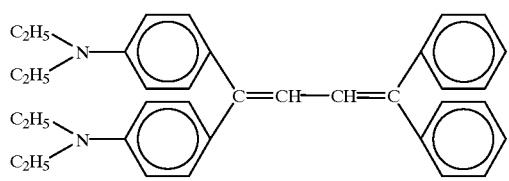
(11)
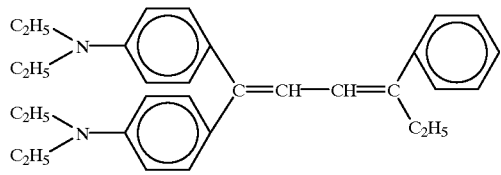
(12)
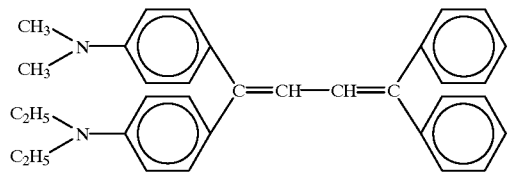
(13)
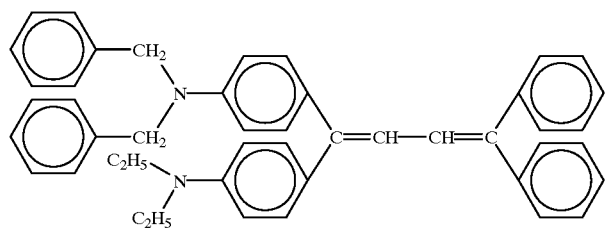
(14)

-continued
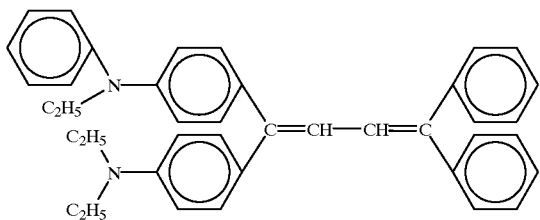
(15)
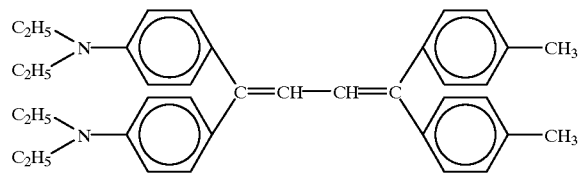
(16)
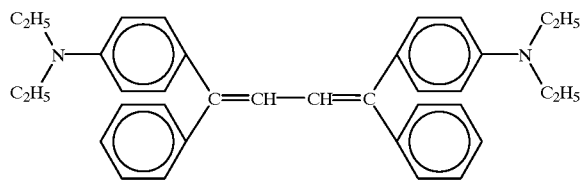
(17)
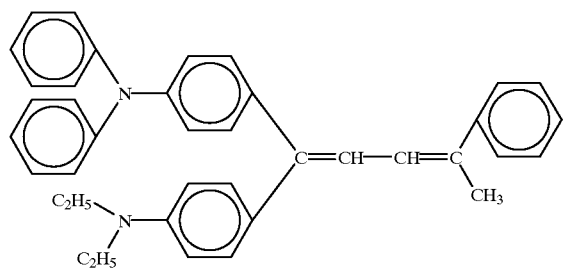
(18)
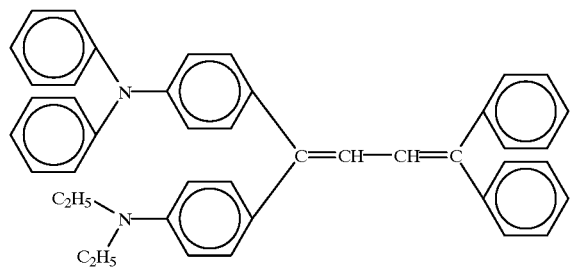
(19)
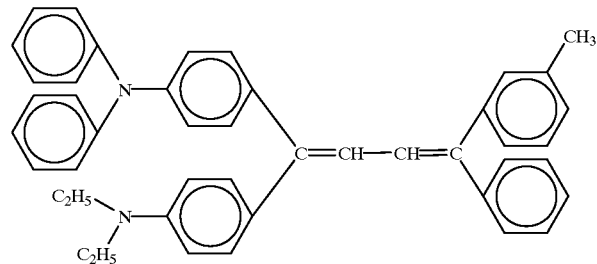
(20)

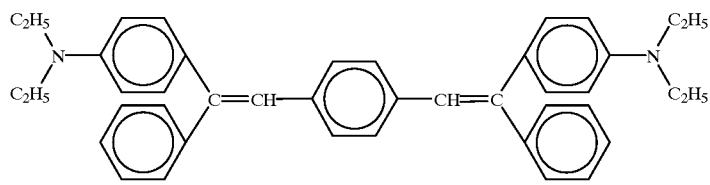
(21)
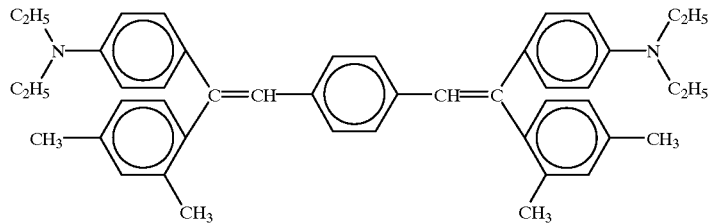
(22)
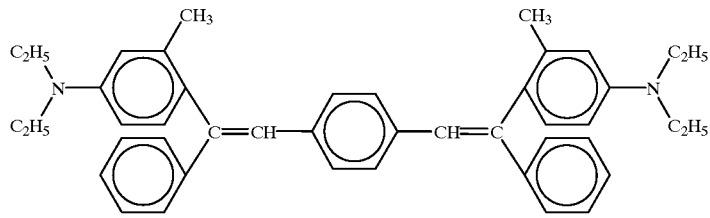
(23)
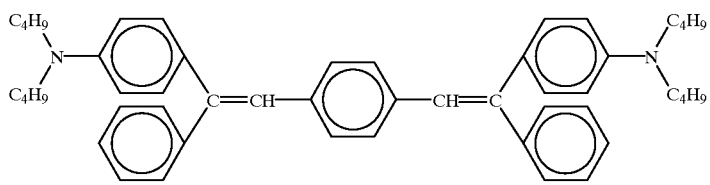
(24)
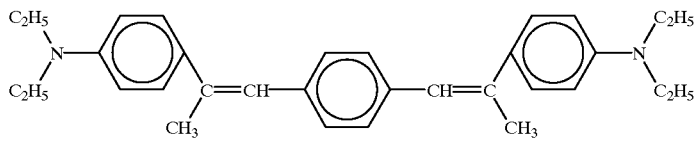
(25)
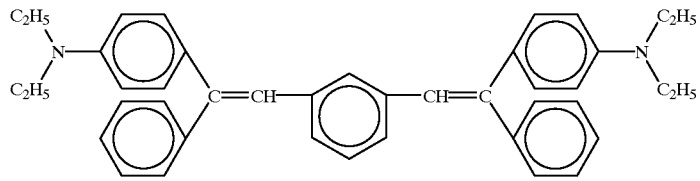
(26)
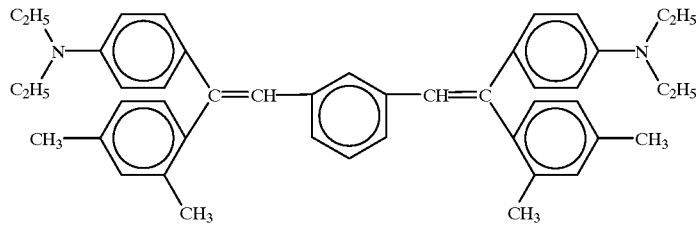
(27)

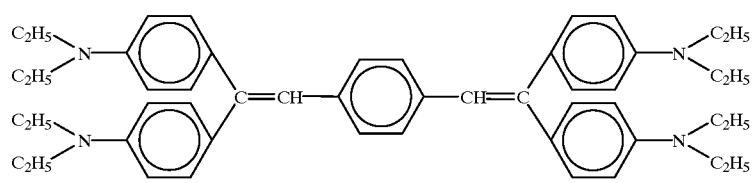
(28)
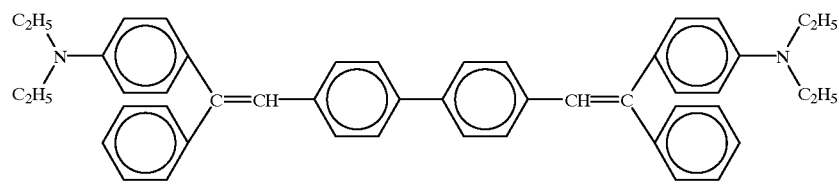
(29)
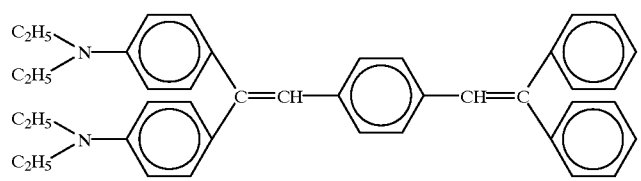
(30)
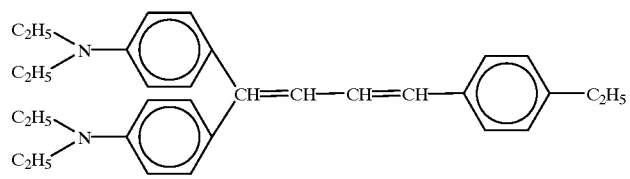
(31)
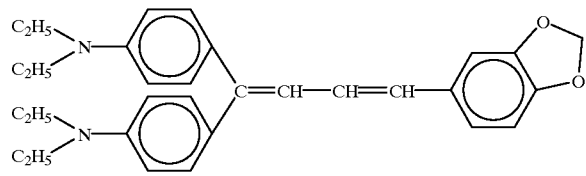
(32)
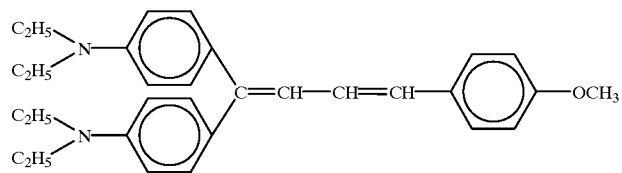
(33)
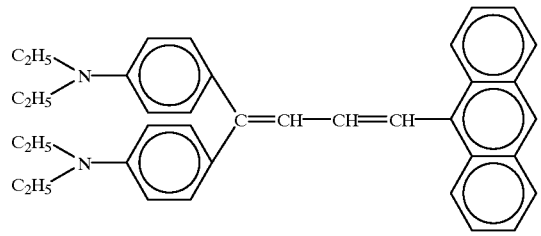
(34)

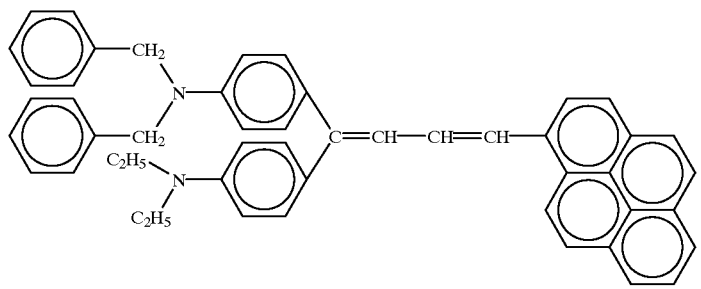
(35)
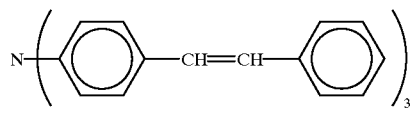
(36)
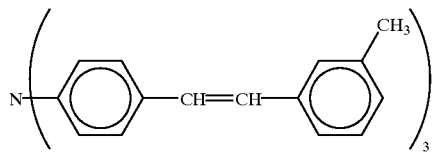
(37)
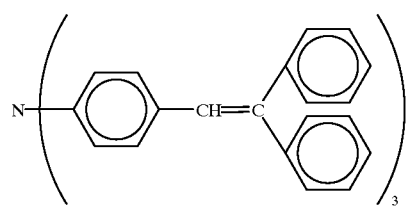
(38)
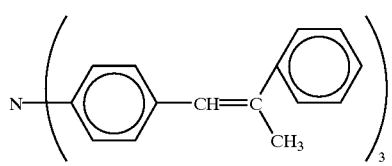
(39)
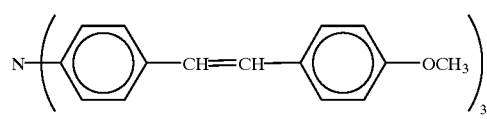
(40)
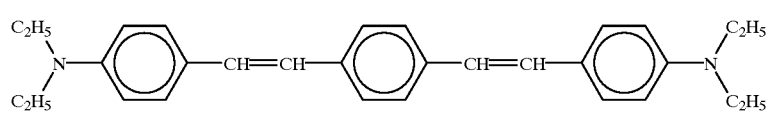
(41)
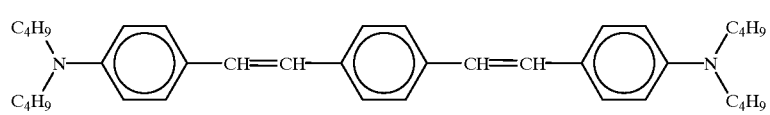
(42)
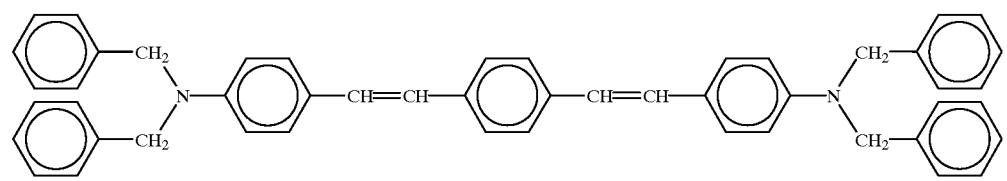
(43)
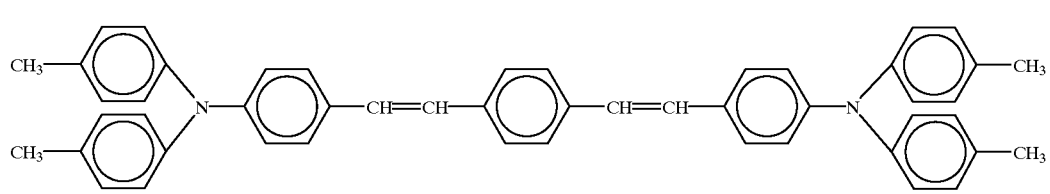
(44)

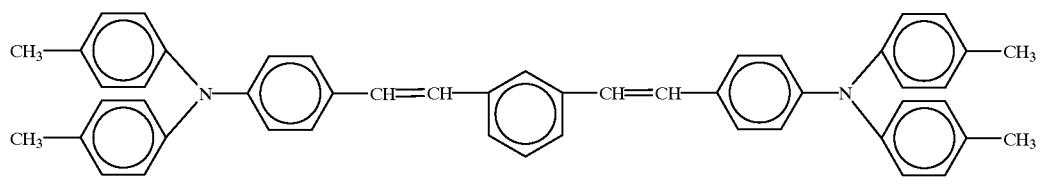
(45)
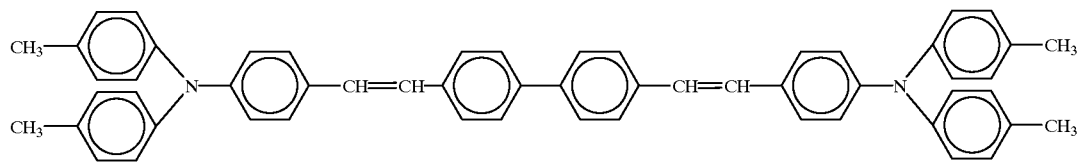
(46)
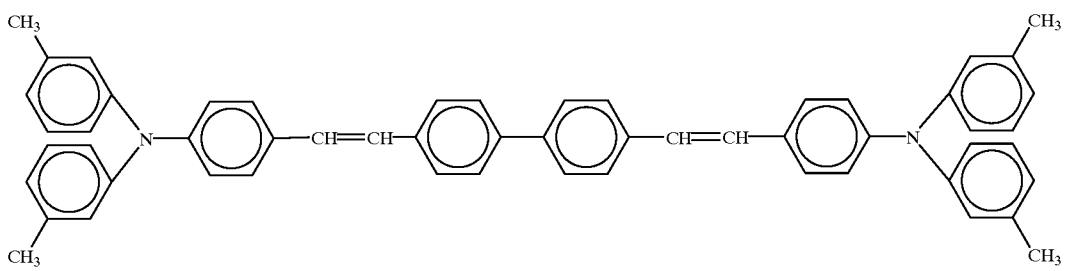
(47)
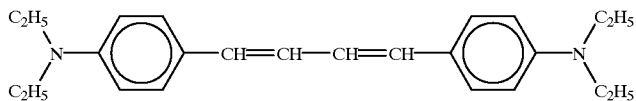
(48)
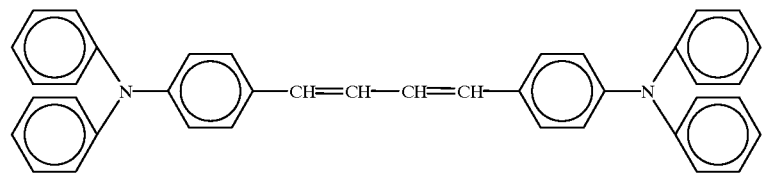
(49)
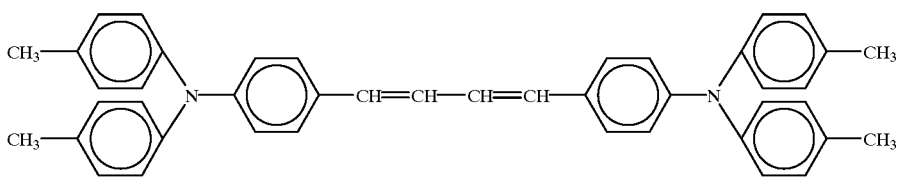
(50)
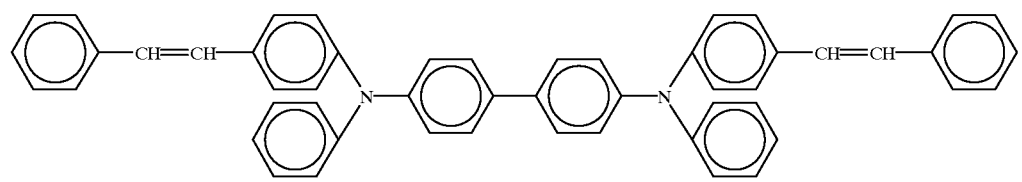
(51)
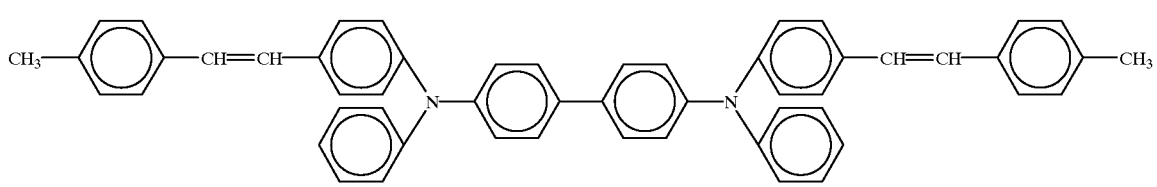
(52)

(53)
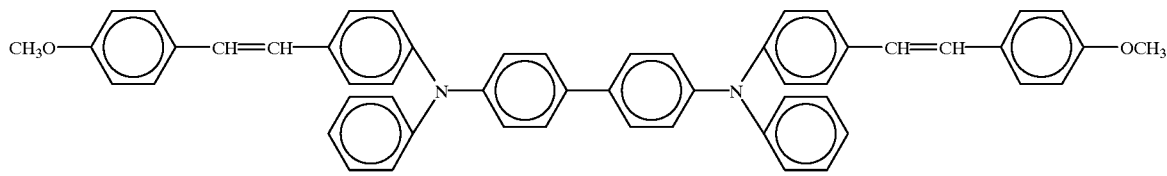

(54)
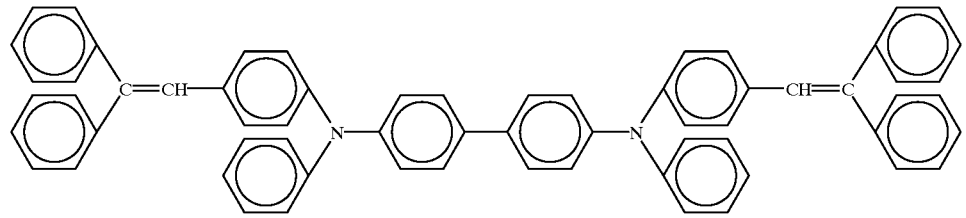

(55)
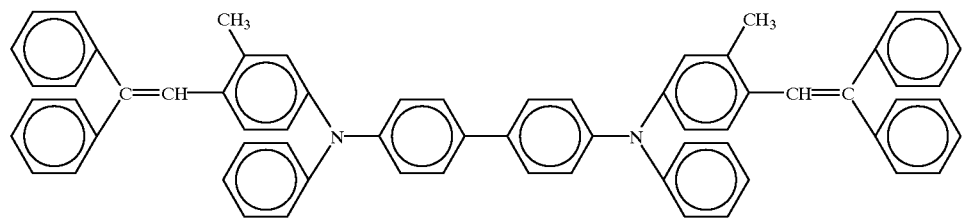

Hole-injection layer (2) may be formed by vacuum deposition of the aforesaid materials, or may be formed by dip-coating or spin-coating of a solution in which said materials are dissolved or dissolved together with a suitable resin.

When forming the hole-injection layer via vacuum deposition, the thickness of the layer is normally 0.1–30 nm, and when formed via an application method, the thickness is about 1–50 nm.

Fatigue of the organic electroluminescent element readily occurs when luminescence efficiency deteriorates due to the necessity of applying a higher voltage to induce luminescence as the layer thickness increases. When the layer is too thin, luminescence efficiency is excellent, but the layer becomes susceptible to breakdown which shortens the service life of the organic electroluminescent element.

Next a hole-transporting layer (3) is formed on the hole-injection layer (2). The hole-transporting layer is formed so as to have an ionization potential of 5.20–5.70 eV, and preferably 5.20–5.68 eV. It is desirable that the ionization potential of the hole-transporting layer (3) is higher than the ionization potential of the hole-injection layer (2), i.e., 0.05–0.70 eV higher, and preferably 0.08–0.67 eV higher.

The compounds used to form the hole-transporting layer will be compounds having hole-transporting characteristics and are not limited insofar as such compounds possess the aforesaid characteristics. Examples of useful compounds include arylamino compounds, specific examples of which are given below. These compounds may be used in combinations of two or more.

(61)
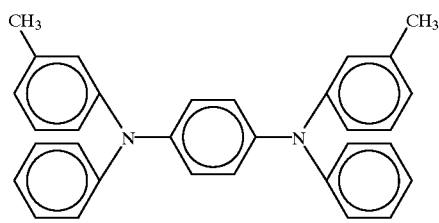

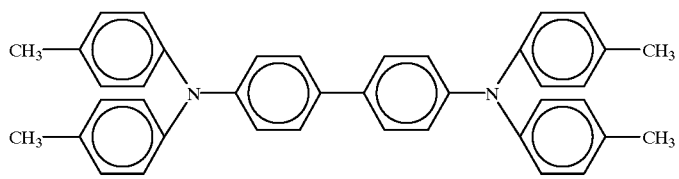
(62)
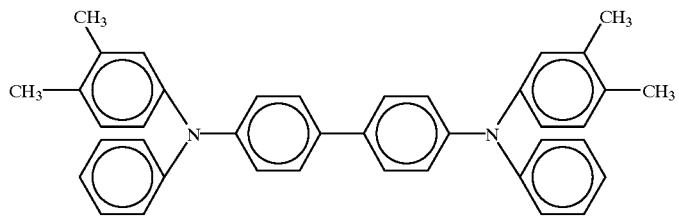
(63)
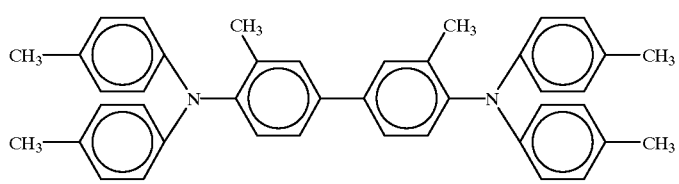
(64)
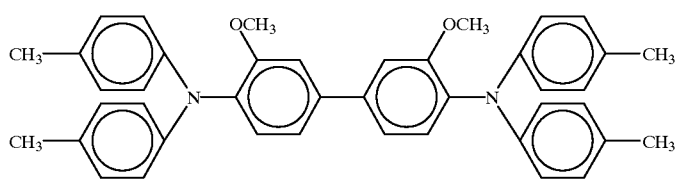
(65)
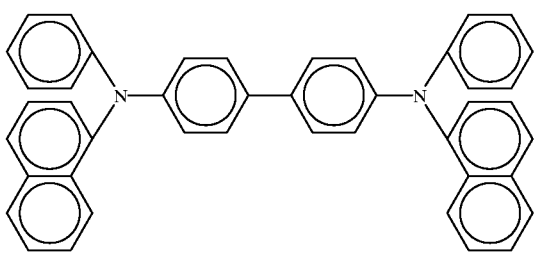
(66)
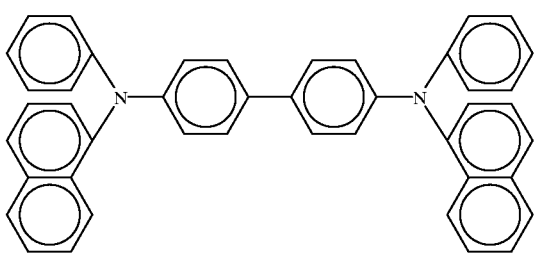
(67)
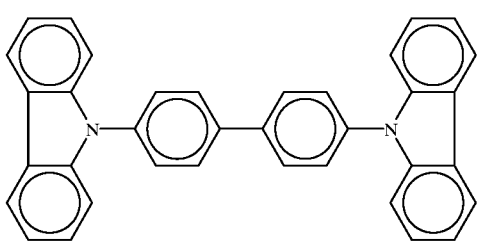
(68)
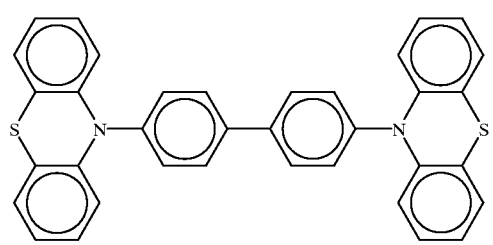
(69)

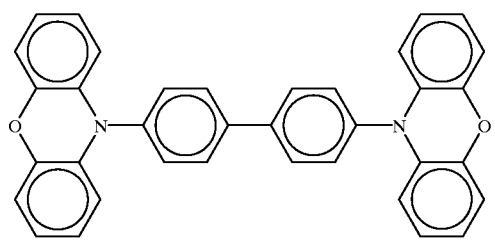
(70)
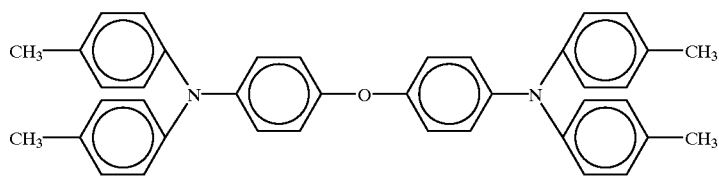
(71)
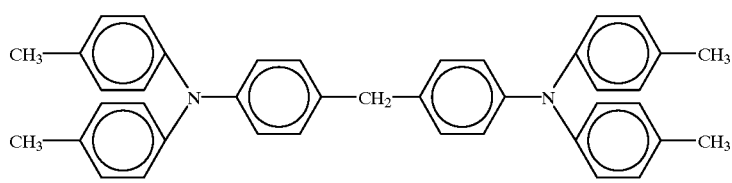
(72)
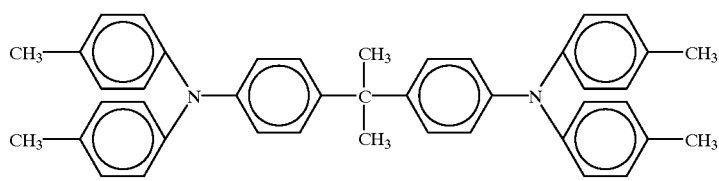
(73)
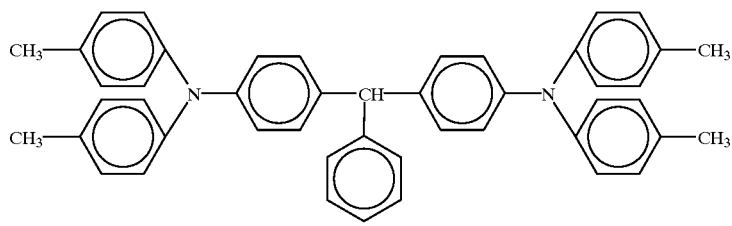
(74)
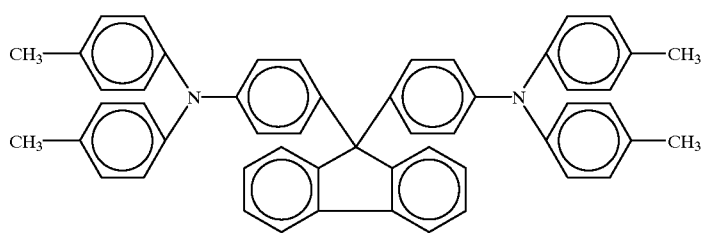
(75)
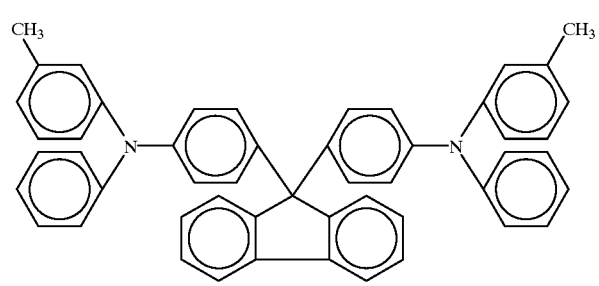
(76)

-continued
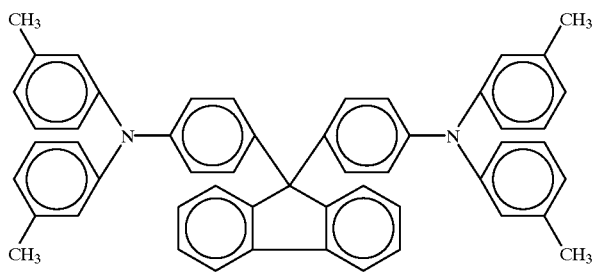
(77)
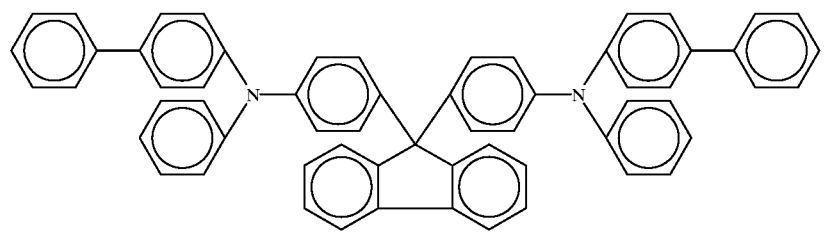
(78)
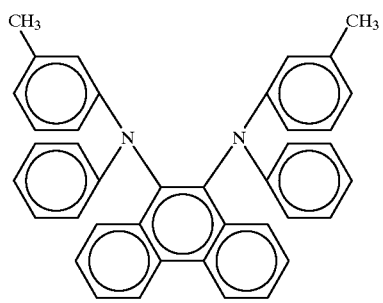
(79)
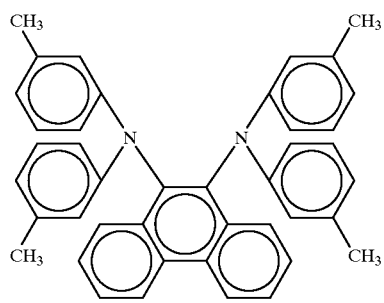
(80)
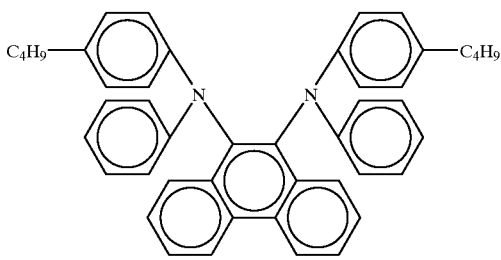
(81)
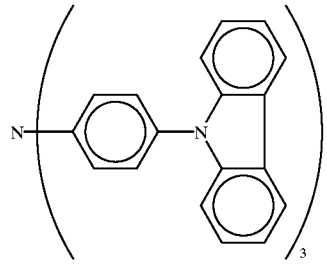
(82)
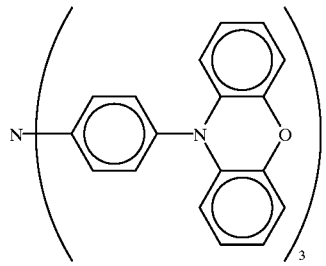
(83)
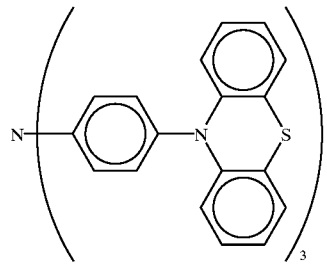
(84)

(85) 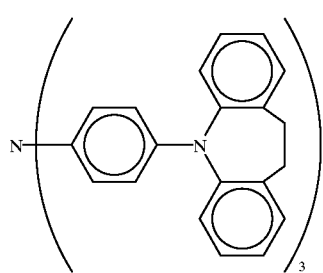
(86) 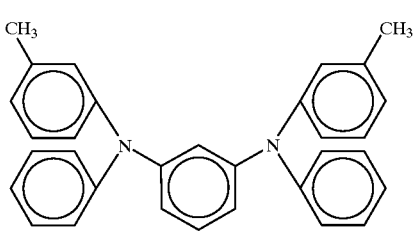
(87) 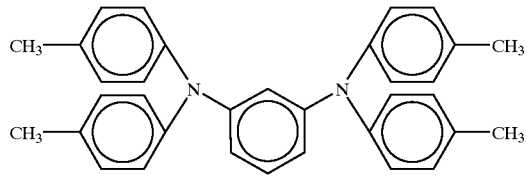
(88) 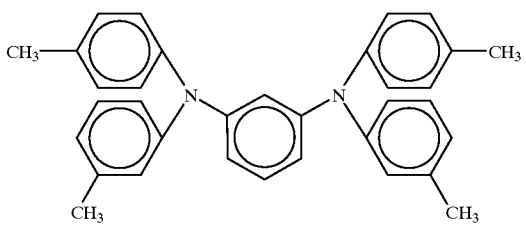
(89) 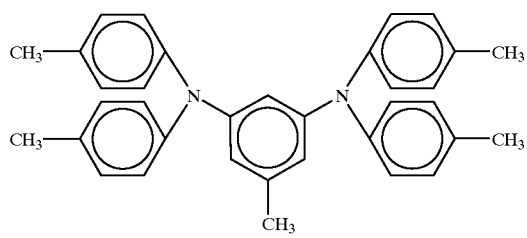
(90) 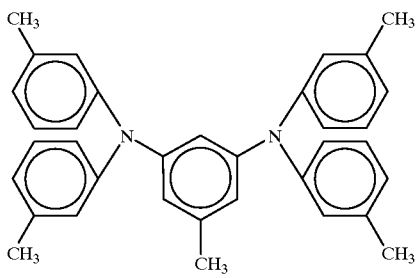
(91) 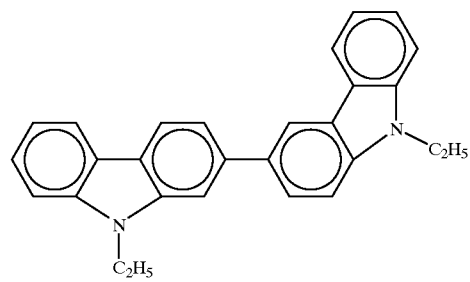
(92) 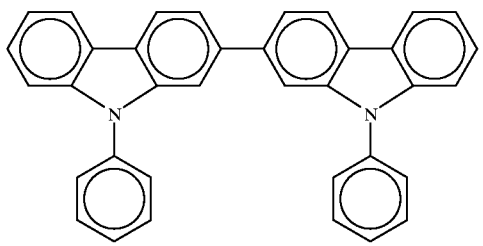
(93) 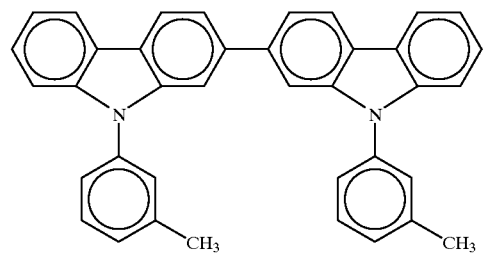
(94) 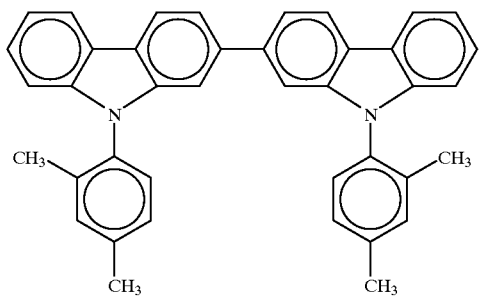

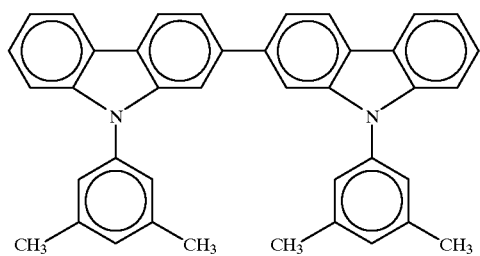

(95)

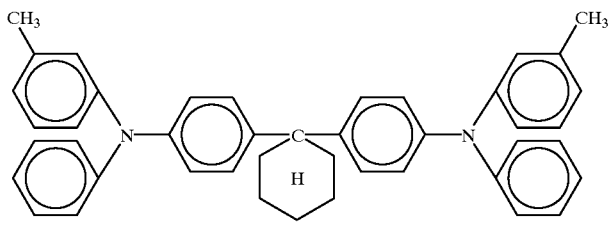

(96)

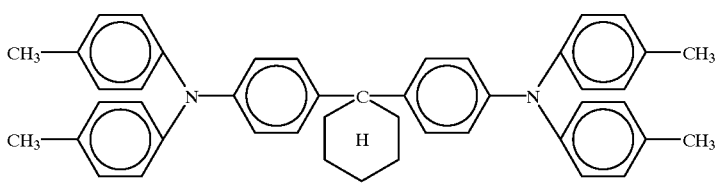

(97)

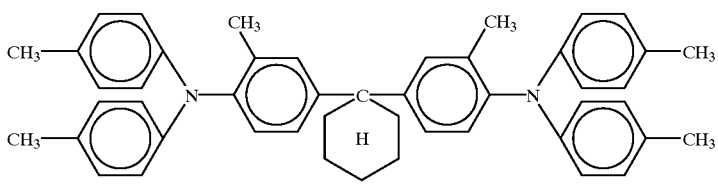

(98)

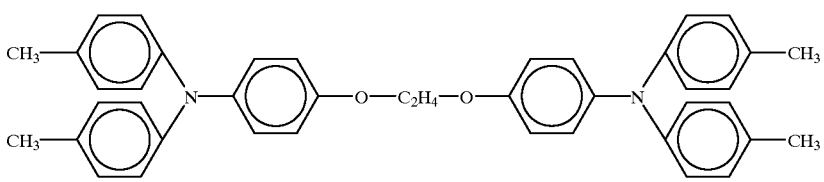

(99)

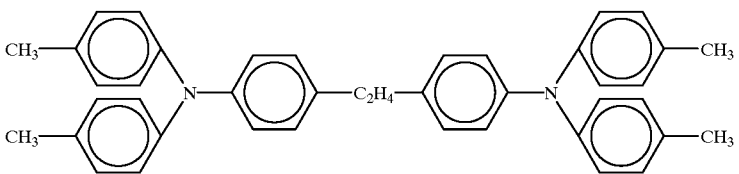

(100)

The hole-transporting layer (3) may be formed by vacuum deposition of the aforesaid materials, or may be formed by dip-coating or spin-coating of a solution in which said materials are dissolved or dissolved together with a suitable resin.

When forming the hole-transporting layer via vacuum deposition, the thickness of the layer is normally 30–100 nm, and when formed via an application method, the thickness is about 50–200 nm.

Fatigue of the organic electroluminescent element occurs and luminescence efficiency deteriorates due to the necessity of applying a higher voltage as the layer thickness increases. When the layer is too thin, luminescence efficiency is excellent, but the layer becomes susceptible to breakdown which shortens the service life of the organic electroluminescent element.

An organic luminescent layer 4 is formed on the aforesaid hole-transporting layer 3. Examples of well known organic luminescent materials which are usable as the organic luminescent layer 4 include epidridine, 2,5-bis[5,7-di-t-pentyl-2-benzooxazolyl]thiophene, 2,2'-(1,4-phenylenedivinylene) bisbenzothiazole, 2,2'-(4,4'-biphenylene)bisbenzothiazole, 5-methyl-2-{2-[4-(5-methyl-2-benzooxazolyl)phenyl] vinyl}benzooxazole, 2,5-bis(5-methyl-2-benzooxazolyl)

thiophene, anthracene, naphthalene, phenanthrene, pyrene, chrysene, perylene, perynone, 1,4-dipehnylbutadiene, tetraphenylbutadiene, coumarin, acridine, stilbene, 2-(4-biphenyl)-6-phenylbenzooxazole, aluminum trisoxine, magnesium bisoxine, bis(benzo-8-quinolinol)zinc, bis(2-methyl-8-quinolinol)aluminum oxide, indium trisoxine, aluminum tris(5-methyloxine), lithium oxine, gallium trisoxine, calcium bis(5-chlorooxine), polyzinc-bis(8-hydroxy-5-quinolinolyl) methane, dilithium epindridione, zinc bisoxine, 1,2-phthaloperinone, 1,2-naphthaloperinone and the like.

Typical fluorescent dyes are also usable, e.g., coumarin dyes, perylene dyes, pyran dyes, thiopyran dyes, polymethine dyes, merocyrine dyes, imidazole dyes and the like. Among these, the most desirable materials are chelated oxynoid compounds.

The organic luminescent layer may have a single layer construction of the aforesaid luminescent materials, or may have a multilayer construction to regulate properties such as the color of luminescence, strength of luminescence and the like. The luminescent layer may be doped by mixing two or more types of luminescent materials.

When forming the organic luminescent layer via vacuum deposition, the thickness of the layer is normally 1–200 nm, and when formed via an application method, the thickness is about 5–500 nm.

Fatigue of the organic electroluminescent element occurs when luminescence efficiency deteriorates due to the necessity of applying a higher voltage as the layer thickness increases. When the layer is too thin, luminescence efficiency is excellent, but the layer becomes susceptible to breakdown which shortens the service life of the organic electroluminescent element.

A negative electrode is formed on the organic luminescent layer (4). As in the foregoing description layers were sequentially formed on the positive electrode (1) in the order: hole-injection layer (2), hole-transporting layer (3), organic luminescent layer (4), and negative electrode (5). These layers may also be formed sequentially on the negative electrode (5) in the reverse order: organic luminescent layer (4), hole-transporting layer (3), hole-injection layer (2) and positive electrode (1).

Figure 2:
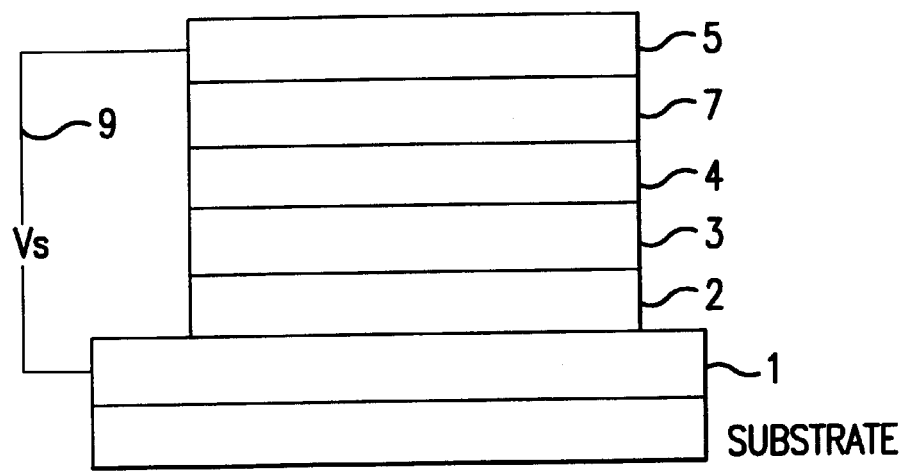
FIG. 2 is a cross-sectional view showing an embodiment of the organic electroluminescent element of the present invention, comprising a substrate, a positive electrode, a hole-injection layer, a hole-transporting layer, an organic luminescent layer, an electron-injection layer, and a negative electrode.

In the present invention, an electron-injection layer (7) may be interposed between the organic luminescent layer (4) and negative electrode (5), as shown in FIG. 2. It is desirable to form the electron-injection layer using a mixed layer of an electron-transporting material and metal, or metal fluoride layer. Brightness of the luminescent element can be increased by the formation of an electron-injection layer, and the drive voltage can be reduced to prolong the service life.

Examples of electron-transporting materials which are useful in a mixed layer of an electron-transporting material and metal include 2-(4-biphenylyl)-5-(4-tert-butylphenyl)-1,3,4-oxadiazole, 2-(1-naphthyl)-5-(4-tert-butylphenyl)-1,3,4-oxadiazole, 1,4-bis{2-[5-(4-tert-butylphenyl)-1,3,4-oxadiazolyl]}benzene, 1,3-bis{2-[5-(4-tert-butylphenyl)-1,3,4-oxadiazolyl]}benzene, 4,4'-bis{2-[5-(4-tert-butylphenyl)-1,3,4-oxadiazolyl]}biphenyl, 2-(4-biphenylyl)-5-(4-tert-butylphenyl)-1,3,4-thiodiazole, 2-(1-naphthyl)-5-(4-tert-butylphenyl)-1,3,4-thiodiazole, 1,4,-bis{2-[5-(4-tert-butylphenyl)-1,3,4-thiodiazolyl]}benzene, 1,3,-bis{2-[5-(4-tert-butylphenyl)-1,3,4-thiodiazolyl]}benzene, 4,4'-bis{2-[5-(4-tert-butylphenyl)-1,3,4-thiodiazolyl]}biphenyl, 3-(4-biphenylyl)-4-phenyl-5-(4-tert-butylphenyl)-1,2,4-triazole, 3-1-naphthyl)-4-phenyl-5-(4-tert-butylphenyl)-1,2,4-triazole, 1,4,-bis{3-[4-phenyl-5-(4-tert-butylphenyl)-1,2,4-triazolyl]}benzene, 1,3-bis{3-[4-phenyl-5-(4-tert-butylphenyl)-1,3,4-oxadiazolyl]}benzene, 4,4'-bis{2-[4-phenyl-5-(4-tert-butylphenyl)-1,3,4-oxadiazolyl]}biphenyl, 1,3,5-tris{2-[5-(4-tert-butylphenyl)-1,3,4-oxadiazolyl]}benzene and the like. These materials may be used in combinations of two or more.

When the aforesaid organic luminescent material has an electron-transporting function, the organic luminescent material may be used as an electron-transporting material in an electron-injection layer. In this instance, it is desirable that the same material is used for the organic luminescent material. Examples of useful materials include aluminum trisoxine, phenylbenzooxazole Zn complex, phenylbenzothiazole Zn complex and the like; most desirable among the aforesaid is aluminum trisoxine.

Metals used together with the aforesaid electron-transporting materials will have a work function of less than 4 eV. Examples of such metals include lithium, magnesium, calcium, titanium, yttrium, gadolinium, ytterbium, ruthenium, manganese and alloys thereof. Among the aforesaid metals, lithium and magnesium are the most desirable.

A desirable combination of the aforesaid metals and electron-transporting materials is aluminum trisoxasine and lithium or magnesium.

The mixing ratio of electron-transporting material and metal is desirably 1:0.05–1:2, and preferably 1:0.5–1:1.2.

When an electron-transporting layer is formed using metal fluoride, LiF, $MgF_2$, $CaF_2$ and the like may be used as the metal fluoride; most desirable among the aforesaid are LiF, $MgF_2$, $CaF_2$.

The electron-injection layer is formed to a thickness of about 0.1–30 nm via vacuum deposition or co-vacuum deposition of said compounds or mixtures thereof.

Figure 3:
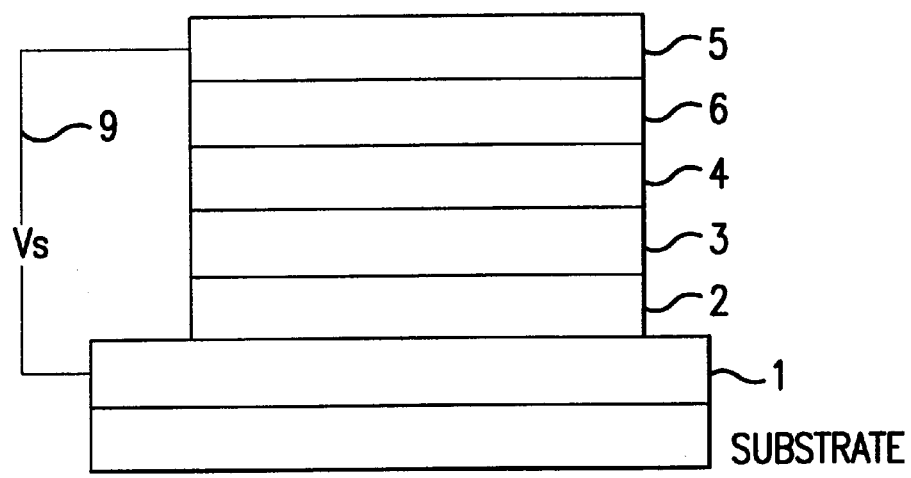
FIG. 3 is a cross-sectional view showing an example of the construction of the organic electroluminescent element of the present invention, comprising a substrate, a positive electrode, a hole-injection layer, a hole-transporting layer, an organic luminescent layer, an electron-transporting layer, and a negative electrode.
Figure 4:
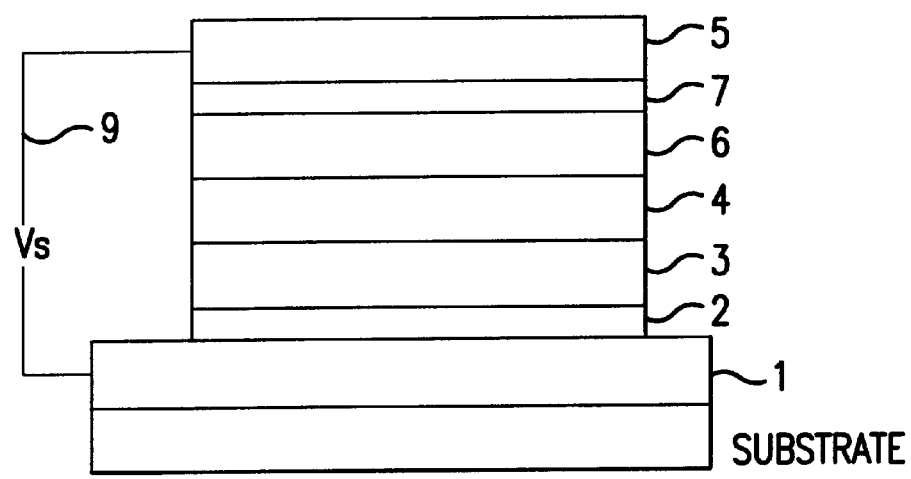
FIG. 4 is a cross-sectional view showing an example of the construction of the organic electroluminescent element of the present invention, comprising a substrate, a positive electrode, a hole-injection layer, a hole-transporting layer, an organic luminescent layer, an electron-transporting layer, an electron-injection layer, and a negative electrode.
Figure 5:
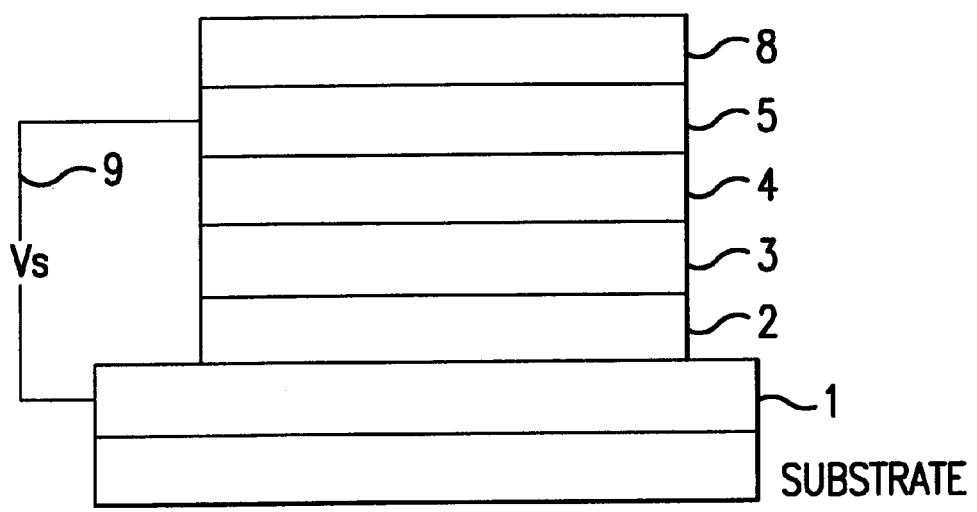
FIG. 5 is a cross-sectional view showing an example of the construction of the organic electroluminescent element of the present invention, comprising a substrate, a positive electrode, a hole-injection layer, a hole-transporting layer, an organic luminescent layer, a negative electrode and a sealing layer.

FIGS. 3–5 show other constructions of the organic electroluminescent member. In FIG. 3, reference number (1) refers to a positive electrode, upon which are sequentially formed a hole-injection layer (2), a hole-transporting layer (3), an organic luminescent layer (4), electron-transporting layer (6), and a negative electrode (5). A point of departure with the construction shown in FIG. 1 is the provision of an electron-transporting layer (6). The ionization potential of the positive electrode, ionization potential of the hole-injection layer, and ionization potential of the hole-transporting layer have the relationships described in terms of FIG. 1.

In FIG. 4, reference number (1) refers to a positive electrode, upon which are sequentially formed a hole-injection layer (2), a hole-transporting layer (3), an organic luminescent layer (4), an electron-transporting layer (6), and an electron-injection layer (7). Points of departure with the construction in FIG. 1 are the provision of an electron-transporting layer (6), and an electron-injection layer (7). The ionization potential of the positive electrode, ionization potential of the hole-injection layer, and ionization potential of the hole-transporting layer have the relationships described in terms of FIG. 1.

In FIG. 5, reference number (1) refers to a positive electrode upon which are sequentially formed a hole-injection layer (2), a hole-transporting layer (3), an organic luminescent layer (4), a negative electrode (5), and a seal layer (8). Only the provision of the seal layer (8) departs from the construction shown in FIG. 1. The ionization potential of the positive electrode, ionization potential of the hole-injection layer, and ionization potential of the hole-transporting layer have the relationships described in terms of FIG. 1.

As shown in FIGS. 3 and 4, when an electron-transporting layer (6) is provided, the same electron-transporting materials may be used as previously described in terms of the electron-injection layer. When an electron-transporting layer is provided, the electron-transporting layer is formed to a thickness of about 30–100 nm via vacuum deposition or co-vacuum deposition of said compounds or mixtures thereof. Furthermore, the electron-injection layer shown in FIG. 4 may be formed identically to the electron-injection layer of FIG. 2.

When the seal layer (8) shown in FIG. 5 is provided, said layer may be formed by vacuum deposition using silicone oxide, zinc oxide, magnesium fluoride, magnesium oxide and the like to achieve a thin layer about 5–1,000 nm in thickness.

The pair of transparent electrodes, i.e., positive electrode (1) and negative electrode (5), are connected via a suitable lead wire such as nickel chrome wire, gold wire, copper wire, platinum wire and the like, and the organic luminescent layer of the organic electroluminescent element luminesces when a suitable voltage Vs is applied to both electrodes.

The present invention provides a luminescent layer with easy hole-injection because the ionization potential of the hole-injection layer is smaller than the ionization potential of the positive electrode. Hole migration in the hole-injection layer and hole-transporting layer occurs because both layers use the same hole-transporting material. In consideration of the elements of greatest dielectric strength the hole-transporting layer and least dielectric durability, the luminescent layer, the present invention provides an element which requires a low voltage to initiate luminescence. Luminescence efficiency and stability over a long service life are provided, as the hole-transporting layer is formed using a material having a large ionization potential.

The organic electroluminescent element of the present invention is suitable for various types of display devices.

The present invention is described hereinafter by way of specific examples.

The organic electroluminescent element of the present invention provides improved luminescence efficiency, better brightness and long service life. The present invention is not limited to the luminescent materials, luminescence enhancing materials, charge transporting materials, sensitizing agents, resins, electrode materials, or element manufacturing methods described in the following examples.

EXAMPLE 1

A thin layer was formed on a glass substrate using indium oxide containing 5 wt % tin oxide (NICHIA KAGAKU) within a reaction chamber which was first reduced to a vacuum of $2\times10^{-5}$ Torr, then filled with oxygen gas to adjust the pressure to $3\times10^{-4}$ Torr. An ITO layer 400 Å in thickness and having a 55.2 atomic % oxygen density was formed using a vacuum deposition device. The vacuum deposition device irradiates the atmosphere in the reaction chamber via electron beam at an electron gun current value of 29 mA and applying an ion-assist current of 300 mA to accomplish deposition at a rate of 20 Å/min. The time for layer formation was 20 minutes. The ionization potential of the ITO layer was 5.20 eV.

Then a thin layer of compound (2) was formed via vacuum deposition in an atmosphere of $1\times10^{-5}$ Torr to a thickness of 10 nm as a hole-injection layer. The ionization potential of the hole-injection layer was 5.12 eV.

Next a thin layer of compound (63) was formed over the hole-injection layer via vacuum deposition to a thickness of 50 nm as a hole-transporting layer. The ionization potential of the hole-transporting layer was 5.20 eV.

A thin layer of aluminum trisoxine was then formed over the hole-transporting layer to a thickness of 60 nm as an organic luminescent layer.

Then a negative electrode 200 nm in thickness was formed using magnesium and silver at an atomic ratio Mg:Ag of 10:1.

An organic electroluminescent element was thus obtained.

Ionization potential was measured using atmospheric type ultraviolet spectrometer (model AC-1; Riken Keiki K.K.).

EXAMPLE 2–4

Organic electroluminescent elements were produced in the same manner as in Example 1 with the exception that compound (4) (ionization potential of the hole-injection layer: 5.10 eV), compound (7) (ionization potential of the hole-injection layer: 5.08 eV), and compound (11) (ionization potential of the hole-injection layer: 4.88 eV) were respectively substituted for compound (2) as the hole-injection layer.

EXAMPLE 5

A thin layer was formed on a glass substrate using indium oxide containing 5 wt % tin oxide (NICHIA KAGAKU) within a reaction chamber which was first reduced to a vacuum of $2\times10^{-5}$ Torr, then filled with oxygen gas to adjust the pressure to $5\times10^{-3}$ Torr. An ITO layer 400 Å in thickness and having a 57.5 atomic % oxygen density was formed using a vacuum deposition device. The vacuum deposition device irradiates the atmosphere in the reaction chamber via electron beam at an electron gun current value of 29 mA and applying an ion-assist current of 300 mA to accomplish deposition at a rate of 20 Å/min. The time for layer formation was 20 minutes. The ionization potential of the ITO layer was 5.25 eV.

Then a thin layer of compound (19) was formed via vacuum deposition in an atmosphere of $1\times10^{-5}$ Torr to a thickness of 10 nm as a hole-injection layer. The ionization potential of the hole-injection layer was 4.95 eV.

Next a thin layer of compound (66) was formed over the hole-injection layer via vacuum deposition to a thickness of 50 nm as a hole-transporting layer. The ionization potential of the hole-transporting layer was 5.25 eV.

A thin layer of aluminum trisoxine was then formed over the hole-transporting layer to a thickness of 20 nm as an organic luminescent layer.

A thin layer of oxadiazole compound (A) 40 nm having the structure shown below was formed to a thickness of 40 nm as an electron-transporting layer.

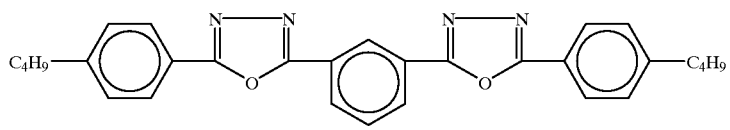

(A)

Then a negative electrode 200 nm in thickness was formed using magnesium and silver at an atomic ratio Mg:Ag of 10:1.

An organic electroluminescent element was thus obtained.

Ionization potential was measured using atmospheric type ultraviolet spectrometer (model AC-1; Riken Keiki K.K.).

EXAMPLE 6–8

Organic electroluminescent elements were produced in the same manner as in Example 5 with the following exception. The compound (22) (ionization potential of the hole-injection layer: 4.80 eV), compound (29) (ionization potential of the hole-injection layer: 5.05 eV), and compound (31) (ionization potential of the hole-injection layer: 4.90 eV) were respectively substituted for compound (19) as the hole-injection layer.

EXAMPLE 9

A transparent positive electrode 100 nm in thickness was formed on a glass substrate via a reactive spattering method using indium oxide containing 8 wt % tin oxide in an atmosphere of $5\times10^{-3}$ Torr using argon as a spattering gas and oxygen as a reactive gas (flow ratio argon:oxygen= 100:1).

Thereafter, the reaction chamber was pressurized to a vacuum of $1.0\times10^{-5}$ Torr without exposure to air. Oxygen gas was introduced within the chamber until a pressure of 0.2 Torr. A high frequency voltage was applied at 0.2 W/cm² for 30 min to plasma wash the ITO substrate. The ionization potential of the ITO substrate was 5.28 eV.

The ITO substrate was placed in a holder within a layer forming device, pressure was reduced to $1.0\times10^{-5}$ Torr, and a thin layer of compound (37) was formed via vacuum to a thickness of 10 nm as a hole-injection layer. The ionization potential of the hole-injection layer was 5.10 eV.

Next a thin layer of compound (76) was formed over the hole-injection layer via vacuum deposition to a thickness of 50 nm as a hole-transporting layer. The ionization potential of the hole-transporting layer was 5.30 eV.

A thin layer of aluminum trisoxine was then formed over the hole-transporting layer to a thickness of 60 nm as an organic luminescent layer.

Then a negative electrode 200 nm in thickness was formed using magnesium and silver at an atomic ratio Mg:Ag of 10:1. An organic electroluminescent element was thus obtained.

EXAMPLE 10

A transparent positive electrode 100 nm in thickness was formed on a glass substrate via a reactive spattering method using indium oxide containing 8 wt % tin oxide in an atmosphere of $5\times10^{-3}$ Torr using argon as a spattering gas and oxygen as a reactive gas (flow ratio argon:oxygen= 100:1).

Thereafter, the reaction chamber was pressurized to a vacuum of $1.0\times10^{-5}$ Torr without exposure to air. Oxygen gas was introduced within the chamber until a pressure of 0.2 Torr. A high frequency voltage was applied at 0.2 W/cm² for 60 min to plasma wash the ITO substrate. The ionization potential of the ITO substrate was 5.35 eV.

The ITO substrate was placed in a holder within a layer forming device, pressure was reduced to $1.0\times10^{-5}$ Torr, and a thin layer of compound (44) was formed via vacuum to a thickness of 20 nm as a hole-injection layer. The ionization potential of the hole-injection layer was 5.01 eV.

Next a thin layer of compound (82) was formed over the hole-injection layer via vacuum deposition to a thickness of 40 nm as a hole-transporting layer. The ionization potential of the hole-transporting layer was 5.68 eV.

A thin layer of aluminum trisoxine was then formed over the hole-transporting layer to a thickness of 60 nm as an organic luminescent layer.

Then a negative electrode 200 nm in thickness was formed using magnesium and silver at an atomic ratio Mg:Ag of 10:1. An organic electroluminescent element was thus obtained.

EXAMPLE 11

A transparent positive electrode 100 nm in thickness was formed on a glass substrate via a reactive spattering method using indium oxide containing 8 wt % tin oxide in an atmosphere of $4\times10^{-2}$ Torr using argon as a spattering gas and oxygen as a reactive gas (flow ratio argon:oxygen= 100:1).

Thereafter, the reaction chamber was pressurized to a vacuum of $1.0\times10^{-5}$ Torr without exposure to air. Oxygen gas was introduced within the chamber until a pressure of 0.2 Torr. A high frequency voltage was applied at 0.2 W/cm² for 30 min to plasma wash the ITO substrate. The ionization potential of the ITO substrate was 5.30 eV.

The ITO substrate was placed in a holder within a layer forming device, pressure was reduced to $1.0\times10^{-5}$ Torr, and a thin layer of compound (50) was formed via vacuum to a thickness of 10 nm as a hole-injection layer. The ionization potential of the hole-injection layer was 5.12 eV.

Next a thin layer of compound (88) was formed over the hole-injection layer via vacuum deposition to a thickness of 50 nm as a hole-transporting layer. The ionization potential of the hole-transporting layer was 5.63 eV.

A thin layer of aluminum trisoxine was then formed over the hole-transporting layer to a thickness of 60 nm as an organic luminescent layer.

Then a negative electrode 200 nm in thickness was formed using magnesium and silver at an atomic ratio Mg:Ag of 10:1. An organic electroluminescent element was thus obtained.

EXAMPLE 12

A transparent positive electrode 100 nm in thickness was formed on a glass substrate via a reaction spattering method using indium oxide containing 8 wt % tin oxide in an atmosphere of 5×10$^{-3}$ Torr using argon as a spattering gas and oxygen as a reactive gas (flow ratio argon:oxygen= 100:1).

Thereafter, the reaction chamber was pressurized to a vacuum of 1.0×10$^{-5}$ Torr without exposure to air. Oxygen gas was introduced within the chamber until a pressure of 0.2 Torr. A high frequency voltage was applied at 0.2 W/cm$^2$ for 30 min to plasma wash the ITO substrate. The ionization potential of the ITO substrate as 5.28 eV.

The ITO substrate was placed in a holder within layer forming device, pressure was reduced to 1.0×10$^{-5}$ Torr, and a thin layer of compound (54) was formed via vacuum to a thickness of 10 nm as a hole-injection layer. The ionization potential of the hole-injection layer was 5.15 eV.

Next a thin layer of compound (86) was formed over the hole-injection layer via vacuum deposition to a thickness of 50 nm as a hole-transporting layer. The ionization potential of the hole-transporting layer was 5.32 eV.

A thin layer of aluminum trisoxine was then formed over the hole-transporting layer to a thickness of 60 nm as an organic luminescent layer.

Then a negative electrode 200 nm in thickness was formed using magnesium and silver at an atomic ratio Mg:Ag of 10:1.

An organic electroluminescent element was thus obtained.

EXAMPLE 13

A thin layer was formed on a glass substrate using indium oxide containing 5 wt % tin oxide (NICHIA KAGAKU) within a reaction chamber which was first reduced to a vacuum of 2×10$^{-5}$ Torr, then filled with oxygen gas to adjust the pressure to 3×10$^{-4}$ Torr. An ITO layer 400 Å in thickness and having a 55.2 atomic % oxygen density was formed using a vacuum deposition device. The vacuum deposition device irradiates the atmosphere in the reaction chamber via electron beam at an electron gun current value of 29 mA and applying an ion-assist current of 300 mA to accomplish deposition at a rate of 20 Å/min. The time for layer formation was 20 minutes. The ionization potential of the ITO layer was 5.20 eV.

Then a thin layer of compound (2) was formed via vacuum deposition in an atmosphere of 1×10$^{-5}$ Torr to a thickness of 10 nm as a hole-injection layer. The ionization potential of the hole-injection layer was 5.12 eV.

Next a thin layer of compound (63) was formed over the hole-injection layer via vacuum deposition to a thickness of 50 nm as a hole-transporting layer. The ionization potential of the hole-transporting layer was 5.20 eV.

A thin layer of aluminum trisoxine was formed via vacuum deposition to a thickness of 60 nm as an organic luminescent layer.

A thin layer of aluminum trisoxine and lithium in a volume ratio of 1:1 was then formed over the hole-transporting layer to a thickness of 20 nm via co-vacuum deposition as a charge injection layer.

Then a negative electrode 200 nm in thickness was formed via vacuum deposition using aluminum.

An organic electroluminescent element was thus obtained.

EXAMPLE 14

A thin layer was formed on a glass substrate using indium oxide containing 5 wt % tin oxide (NICHIA KAGAKU) within a reaction chamber which was first reduced to a vacuum of 2×10$^{-5}$ Torr, then filled with oxygen gas to adjust the pressure to 5×10$^{-8}$ Torr. An ITO layer 400 Å in thickness and having a 57.5 atomic % oxygen density was formed using a vacuum deposition device. The vacuum deposition device irradiates the atmosphere in the reaction chamber via electron beam at an electron gun current value of 29 mA and applying an ion-assist current of 300 mA to accomplish deposition at a rate of 20 Å/min. The time for layer formation was 20 minutes. The ionization potential of the ITO layer was 5.25 eV.

Then a thin layer of compound (19) was formed via vacuum deposition in an atmosphere of 1×10$^{-5}$ Torr to a thickness of 10 nm as a hole-injection layer. The ionization potential of the hole-injection layer was 4.96 eV.

Next a thin layer of compound (66) was formed over the hole-injection layer via vacuum deposition to a thickness of 50 nm as a hole-transporting layer. The ionization potential of the hole-transporting layer was 5.25 eV.

A thin layer of aluminum trisoxine was formed via vacuum deposition to a thickness of 60 nm as an organic luminescent layer.

A thin layer of lithium fluoride was formed over the hole-transporting layer to a thickness of 0.4 nm (monitored by a crystal oscillator type layer measuring device via vacuum deposition) as a charge injection layer.

Then a negative electrode 200 nm in thickness was formed via vacuum deposition using aluminum. An organic electroluminescent element was thus obtained.

EXAMPLE 15

A transparent positive electrode 100 nm in thickness was formed on a glass substrate via a reaction spattering method using indium oxide containing 8 wt % tin oxide in an atmosphere of 5×10$^{-3}$ Torr using argon as a spattering gas and oxygen as a reactive gas (flow ratio argon:oxygen= 100:1).

Thereafter, the reaction chamber was pressurized to a vacuum of 1.0×10$^{-5}$ Torr without exposure to air. Oxygen gas was introduced within the chamber until a pressure of 1 Torr. A high frequency voltage was applied at 0.2 W/cm$^2$ for 60 min to plasma wash the ITO substrate. The ionization potential of the ITO substrate was 5.35 eV.

A thin layer of compound (50) was formed via vacuum to a thickness of 10 nm as a hole-injection layer. The ionization potential of the hole-injection layer was 5.12 eV.

Next a thin layer of compound (66) was formed over the hole-injection layer via vacuum deposition to a thickness of 50 nm as a hole-transporting layer. The ionization potential of the hole-transporting layer was 5.25 eV.

A thin layer of aluminum trisoxine was then formed over the hole-transporting layer to a thickness of 60 nm as an organic luminescent layer.

A thin layer of magnesium fluoride was formed to a thickness of 0.5 nm via vacuum deposition as an electron-injection layer.

Then a negative electrode 200 nm in thickness was formed via vacuum deposition using aluminum. An organic electroluminescent element was thus obtained.

EXAMPLE 16

A transparent positive electrode 100 nm in thickness was formed on a glass substrate via a reaction spattering method using indium oxide containing 8 wt % tin oxide in an atmosphere of 4×10⁻² Torr using argon as a spattering gas and oxygen as a reactive gas (flow ratio argon:oxygen= 100:1).

Thereafter, the reaction chamber was pressurized to a vacuum of 1.0×10⁻⁵ Torr without exposure to air. Oxygen gas was introduced within the chamber until a pressure of 0.2 Torr. A high frequency voltage was applied at 0.2 W/cm² for 30 min to plasma wash the ITO substrate.

The ionization potential of the ITO substrate was 5.30 eV.

The ITO substrate was placed in a holder within a layer forming device, pressure was reduced to 1.0×10⁻⁵ Torr, and a thin layer of compound (50) was formed via vacuum to a thickness of 10 nm as a hole-injection layer. The ionization potential of the hole-injection layer was 5.12 eV.

Next a thin layer of compound (88) was formed over the hole-injection layer via vacuum deposition to a thickness of 50 nm as a hole-transporting layer. The ionization potential of the hole-transporting layer was 5.63 eV.

A thin layer of aluminum trisoxine was then formed over the hole-transporting layer to a thickness of 60 nm as an organic luminescent layer.

A thin layer of aluminum trisoxine and magnesium in a volume ratio of 1:1 was formed via vacuum deposition to a thickness of 10 nm as an electron-injection layer.

Then a negative electrode 200 nm in thickness was formed using magnesium and silver at an atomic ratio Mg:Ag of 10:1. An organic electroluminescent element was thus obtained.

COMPARATIVE EXAMPLE 1

A commercial indium-tin oxide coated glass substrate (NICHIA KAGAKU) was subjected to ultrasonic washing for 20 min using distilled water and acetone. The ionization potential was 4.75 eV.

A thin layer of N,N',N''-triphenyl-N,N',N''-tris(3-methylphenyl)-1,3,5-tri(aminophenyl)benzene 10 nm in thickness was formed on the substrate via vacuum deposition as a hole-injection layer. The ionization potential of the hole-injection layer was 5.10 eV.

Then a thin film of N,N'-diphenyl-N,N'-bis(3,4-dimethylphenyl)-1,1'-diphenyl-4,4'-diamine 60 nm in thickness was formed over the hole-injection layer as a hole-transporting layer. The ionization potential of the hole-transporting layer was 5.20 eV.

A thin layer of aluminum trisoxine 60 nm in thickness was formed via vacuum deposition as an organic luminescent layer.

Then a negative electrode layer 200 nm in thickness was formed via vacuum deposition using magnesium and silver in an atomic ratio of 10:1. Thus, an organic electroluminescent element was produced.

COMPARATIVE EXAMPLE 2

A transparent positive electrode 100 nm in thickness was formed on a glass substrate via a reaction spattering method using indium oxide containing 8 wt % tin oxide in an atmosphere of 5×10⁻³ Torr using argon as a spattering gas and oxygen as a reactive gas (flow ratio argon:oxygen= 100:1). The ionization potential of the layer was 5.15 eV.

Then a thin film of N,N'-diphenyl-N,N'-bis(1-naphthyl)-1,1'-diphenyl-4,4'-diamine 60 nm in thickness was formed as a hole-transporting layer. The ionization potential of the hole-transporting layer was 5.25 eV.

A thin layer of aluminum trisoxine 20 nm in thickness was formed via vacuum deposition as an organic luminescent layer.

A thin layer of oxadiazole (A) 40 nm in thickness was formed via vacuum deposition as an electron-transporting layer.

Then a negative electrode layer of magnesium 200 nm in thickness was formed via vacuum deposition. Thus, an organic electroluminescent element was produced.

COMPARATIVE EXAMPLE 3

A thin layer was formed on a glass substrate using indium oxide containing 5 wt % tin oxide (NICHIA KAGAKU) within a reaction chamber which was first reduced to a vacuum of 2×10⁻⁵ Torr, then filled with oxygen gas to adjust the pressure to 8×10⁻⁵ Torr. An ITO layer 400 Å in thickness and having a 55.2 atomic % oxygen density was formed using a vacuum deposition device. The vacuum deposition device irradiates the atmosphere in the reaction chamber via electron beam at an electron gun current value of 29 mA and applying an ion-assist current of 300 mA to accomplish deposition at a rate of 20 Å/min. The time for layer formation was 20 minutes. The ionization potential of the ITO layer was 5.18 eV.

Then a thin layer of N,N'-diphenyl-N,N'-bis(3-methylphenyl)-1,1'-diphenyl-4,4'-diamine 10 nm in thickness was formed via vacuum deposition in a vacuum of 1×10⁻⁵ Torr as a hole-injection layer. The ionization potential of the hole-injection layer was 5.20 eV.

Then a thin film of N,N'-diphenyl-N,N'-bis(1-naphthyl)-1,1'-diphenyl-4,4'-diamine 50 nm in thickness was formed over the hole-injection layer as a hole-transporting layer. The ionization potential of the hole-transporting layer was 5.25 eV.

A thin layer of aluminum trisoxine 60 nm in thickness was formed via vacuum deposition as an organic luminescent layer.

Then a negative electrode layer of magnesium 200 nm in thickness was formed via vacuum deposition. Thus, an organic electroluminescent element was produced.

COMPARATIVE EXAMPLE 4

A transparent positive electrode 100 nm in thickness was formed on a glass substrate via a reactive spattering method using indium oxide containing 8 wt % tin oxide in an atmosphere of 5×10⁻³ Torr using argon as a spattering gas and oxygen as a reactive gas (flow ratio argon:oxygen= 100:1).

Thereafter, the reaction chamber was pressurized to a vacuum of 1.0×10⁻⁵ Torr without exposure to air. Oxygen gas was introduced within the chamber until a pressure of 1 Torr. A high frequency voltage was applied at 0.2 W/cm² for 30 min to plasma wash the ITO substrate. The ionization potential of the ITO substrate was 5.37 eV.

The ITO substrate was placed in a holder within a layer forming device, pressure was reduced to 1.0×10⁻⁵ Torr, and a thin layer of compound (54) was formed via vacuum to a thickness of 10 nm as a hole-injection layer. The ionization potential of the hole-injection layer was 5.15 eV.

Next a thin layer of compound (86) was formed over the hole-injection layer via vacuum deposition to a thickness of 50 nm as a hole-transporting layer. The ionization potential of the hole-transporting layer was 5.32 eV.

A thin layer of aluminum trisoxine was then formed over the hole-transporting layer to a thickness of 60 nm as an organic luminescent layer.

Then a negative electrode 200 nm in thickness was formed using magnesium and silver at an atomic ratio Mg:Ag of 10:1.

An organic electroluminescent element was thus obtained.

COMPARATIVE EXAMPLE 5

A thin layer was formed on a glass substrate using indium oxide containing 5 wt % tin oxide (NICHIA KAGAKU) within a reaction chamber which was first reduced to a vacuum of $2\times10^{-5}$ Torr, then filled with oxygen gas to adjust the pressure to $3\times10^{-4}$ Torr. An ITO layer 400 Å in thickness and having a 55.2 atomic % oxygen density was formed using a vacuum deposition device. The vacuum deposition device irradiates the atmosphere in the reaction chamber via electron beam at an electron gun current value of 29 mA and applying an ion-assist current of 300 mA to accomplish deposition at a rate of 20 Å/min. The time for layer formation was 20 minutes. The ionization potential of the ITO layer was 5.20 eV.

Then a thin layer of compound (B) was formed via vacuum deposition in an atmosphere of $1\times10^{-5}$ Torr to a thickness of 10 nm as a hole-injection layer. The ionization potential of the hole-injection layer was 4.76 eV.

(B)

Next a thin layer of compound (63) was formed over the hole-injection layer via vacuum deposition to a thickness of 50 nm as a hole-transporting layer. The ionization potential of the hole-transporting layer was 5.20 eV.

A thin layer of aluminum trisoxine was then formed over the hole-transporting layer to a thickness of 60 nm as an organic luminescent layer.

Then a negative electrode 200 nm in thickness was formed using magnesium and silver at an atomic ratio Mg:Ag of 10:1.

An organic electroluminescent element was thus obtained.

COMPARATIVE EXAMPLE 6

A thin layer was formed on a glass substrate using indium oxide containing 5 wt % tin oxide (NICHIA KAGAKU) within a reaction chamber which was first reduced to a vacuum of $2\times10^{-5}$ Torr, then filled with oxygen gas to adjust the pressure to $3\times10^{-4}$ Torr. An ITO layer 400 Å in thickness and having a 55.2 atomic % oxygen density was formed using a vacuum deposition device. The vacuum deposition device irradiates the atmosphere in the reaction chamber via electron beam at an electron gun current value of 29 mA and applying an ion-assist current of 300 mA to accomplish deposition at a rate of 20 Å/min. The time for layer formation was 20 minutes. The ionization potential of the ITO layer was 5.20 eV.

Then a thin layer of compound (2) was formed via vacuum deposition in an atmosphere of $1\times10^{-5}$ Torr to a thickness of 10 nm as a hole-injection layer. The ionization potential of the hole-injection layer was 5.12 eV.

Next a thin layer of compound (C) was formed over the hole-injection layer via vacuum deposition to a thickness of 50 nm as a hole-transporting layer. The ionization potential of the hole-transporting layer was 5.72 eV.

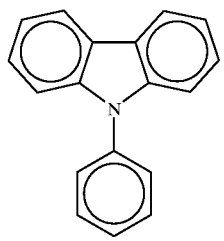

(C)

A thin layer of aluminum trisoxine was then formed over the hole-transporting layer to a thickness of 60 nm as an organic luminescent layer.

Then a negative electrode 200 nm in thickness was formed using magnesium and silver at an atomic ratio Mg:Ag of 10:1.

An organic electroluminescent element was thus obtained.

Evaluation

Ionization potential was measured using and atmospheric type ultraviolet spectrometer (model AC-1; Riken Keiki K.K.).

The organic electroluminescent elements produced in Examples 1–16 and Comparative Examples 1–3 were examined by using the glass electrode as a positive electrode, and measuring the voltage V needed to initiate luminescence by a direct current (DC) voltage gradually applied, and the luminescence brightness (cd/m2) when a 10V DC voltage was applied.

The rate of reduction (%) of initial output was determined when the elements were operated for 10 hr at an initial brightness 300 cd/m2 (i.e., output after 10 hr $(mW/cm^2)$/ initial output $(mW/cm^2)\times100$).

Measurement results are shown in Table 1.

TABLE 1

|  | Luminescence Start Voltage | Luminescence Brightness at 10 V (cd/m2) | Rate of Reduction of Initial Output (%) |
| --- | --- | --- | --- |
| Ex 1 | 3.5 | 13450 | 91 |
| Ex 2 | 3.3 | 14370 | 90 |
| Ex 3 | 3.2 | 16290 | 88 |
| Ex 4 | 2.9 | 18510 | 92 |
| Ex 5 | 3.0 | 11560 | 90 |
| Ex 6 | 2.9 | 18350 | 89 |
| Ex 7 | 3.1 | 18920 | 91 |
| Ex 8 | 3.0 | 17640 | 90 |
| Ex 9 | 3.2 | 15290 | 89 |
| Ex 10 | 3.0 | 18930 | 92 |
| Ex 11 | 3.2 | 13910 | 90 |
| Ex 12 | 3.5 | 12750 | 88 |
| Ex 13 | 3.0 | 23240 | 93 |
| Ex 14 | 2.9 | 27510 | 94 |
| Ex 15 | 3.0 | 25490 | 94 |
| Ex 16 | 3.0 | 20370 | 93 |
| CE 1 | 4.0 | 6500 | 81 |
| CE 2 | 4.8 | 2690 | 75 |
| CE 3 | 4.5 | 3750 | 78 |
| CE 4 | 5.3 | 7240 | 79 |
| CE 5 | 2.9 | 8230 | 76 |
| CE 6 | 3.2 | 9750 | 80 |
| CE 7 | 6.0 | 2430 | 67 |

As can be understood from Table 1, the organic electroluminescent element of the present invention starts luminescing at a low potential, and provides excellent luminescence brightness.

Furthermore, the organic electroluminescent element of the present invention provides minimal reduction of output to realize stable luminescence over a long service life.

The organic electroluminescent element of the present invention provides excellent durability with increased luminescence intensity and low luminescence starting voltage by adjusting the positive electrode to have an ionization potential of 5.18–5.35 eV, the hole-injection layer to have an ionization potential of 4.80–5.18 eV, and the hole-transporting layer to have an ionization potential of 5.20–5.70 eV.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. An organic electroluminescent element, comprising:
   a positive electrode having an ionization potential of 5.18–5.35 eV;
   a hole-injection layer having an ionization potential of 4.80–5.18 eV and formed on the positive electrode, the ionization potential of the hole-injection layer being lower than that of the positive electrode;
   a hole-transporting layer having an ionization potential of 5.20–5.70 eV formed on the hole-injection layer;
   an organic luminescent layer formed on the hole-transporting layer; and
   a negative electrode.

2. The organic electroluminescent element claimed in claim 1, wherein the positive electrode has an ionization potential of 5.20–5.35 eV.

3. The organic electroluminescent element claimed in claim 1, wherein the hole-injection layer has an ionization potential of 4.80–5.15 eV.

4. The organic electroluminescent element claimed in claim 1, wherein the hole-transporting layer has an ionization potential of 5.20–5.68 eV.

5. The organic electroluminescent element claimed in claim 1, wherein the ionization potential of the hole-injection layer is 0.05–0.45 eV lower than that of the positive electrode.

6. The organic electroluminescent element claimed in claim 5, wherein the ionization potential of the hole-injection layer is 0.08–0.40 eV lower than that of the positive electrode.

7. The organic electroluminescent element claimed in claim 1, wherein the ionization potential of the hole-transporting layer is 0.05–0.70 eV higher than that of the hole-injection layer.

8. The organic electroluminescent element claimed in claim 1, wherein the ionization potential of the hole-transporting layer is 0.08–0.67 eV higher than that of the hole-injection layer.

9. The organic electroluminescent element claimed in claim 1, wherein the hole-injection layer comprises a styryl compound and the hole-transporting layer comprises an arylamino compound.

10. The organic electroluminescent element claimed in claim 1, wherein the negative electrode is formed on the organic luminescent layer.

11. The organic electroluminescent element claimed in claim 1, comprising an electron-injection layer formed on the organic luminescent layer.

12. The organic electroluminescent element claimed in claim 11, wherein the electron-injection layer comprises an electron-transporting material and a metal.

13. The organic electroluminescent element claimed in claim 11, wherein the electron-injection layer comprises a metal fluoride.

14. The organic electroluminescent element claimed in claim 1, comprising an electron-transporting layer formed on the organic luminescent layer.

15. The organic electroluminescent element claimed in claim 14, wherein the electron-transporting layer comprises an electron-transporting material.

16. The organic electroluminescent element claimed in claim 1, comprising an electron-injection layer and an electron-transporting layer, the electron-transporting layer formed on the organic luminescent layer and the electron-transporting layer formed on the electron-transporting layer.

17. The organic electroluminescent element claimed in claim 1, comprising a transparent substrate, the positive electrode formed on the transparent substrate.

18. The organic electroluminescent element claimed in claim 1, comprising a seal layer formed on the negative electrode.

19. A display element comprising the organic electroluminescent element of claim 1.

20. An organic electroluminescent element comprising:
   a positive electrode having an ionization potential of 5.18–5.35 eV;
   a hole-injection layer having an ionization potential of 4.80–5.18 eV and formed on the positive electrode, the ionization potential of the hole-injection layer being 0.05–0.45 eV lower than that of the positive electrode;
   a hole-transporting layer having an ionization potential of 5.20–5.70 eV formed on the hole-injection layer, the ionization potential of the hole-transporting layer being 0.05–0.70 eV higher than that of the hole-injection layer;
   an organic luminescent layer formed on the hole-transporting layer; and
   a negative electrode.

21. The organic electroluminescent element claimed in claim 20, wherein the ionization potential of the hole-injection layer is 0.08–0.40 eV lower than that of the positive electrode and the ionization potential of the hole-transporting layer is 0.08–0.67 eV higher than that of the hole-injection layer.

22. The organic electroluminescent element claimed in claim 20, wherein the positive electrode has the ionization potential of 5.20–5.35 eV, the hole-injection layer has the ionization potential of 4.80–5.15 eV and the hole-transporting layer has the ionization potential of 5.20–5.68 eV.

23. The organic electroluminescent element claimed in claim 20, comprising an electron-injection layer between the organic luminescent layer and the negative electrode.

24. The organic electroluminescent element claimed in claim 20, comprising an electron-transporting layer between the organic luminescent layer and negative electrode.

* * * * *